(12) United States Patent
Tsunoda et al.

(10) Patent No.: US 9,699,886 B2
(45) Date of Patent: Jul. 4, 2017

(54) ELECTRONIC DEVICE

(71) Applicant: FUJITSU LIMITED, Kawasaki-shi, Kanagawa (JP)

(72) Inventors: Yosuke Tsunoda, Tachikawa (JP); Jie Wei, Hachioji (JP); Masumi Suzuki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 75 days.

(21) Appl. No.: 14/838,488

(22) Filed: Aug. 28, 2015

(65) Prior Publication Data

US 2016/0143128 A1 May 19, 2016

(30) Foreign Application Priority Data

Nov. 18, 2014 (JP) ................. 2014-234028

(51) Int. Cl.
*H05K 7/20* (2006.01)
*H01L 23/367* (2006.01)
*H05K 1/02* (2006.01)
*G06F 1/20* (2006.01)

(52) U.S. Cl.
CPC ........... *H05K 1/0209* (2013.01); *G06F 1/203* (2013.01); *H01L 23/3672* (2013.01); *H05K 2201/066* (2013.01); *H05K 2201/10409* (2013.01)

(58) Field of Classification Search
CPC .. H05K 3/4641; H05K 3/4611; H05K 1/0209; H05K 2201/066; H05K 2201/10409
See application file for complete search history.

(56) References Cited

U.S. PATENT DOCUMENTS

| 5,794,684 A | * | 8/1998 | Jacoby | F28F 3/02 165/185 |
| 5,982,284 A | * | 11/1999 | Baldwin | G06K 19/0672 29/829 |
| 6,301,779 B1 | * | 10/2001 | Azar | B23P 15/26 165/80.3 |
| 7,172,130 B2 | * | 2/2007 | Tsunoda | G06K 19/07728 235/492 |
| 9,059,129 B2 | * | 6/2015 | Wavering | H01L 23/3735 |
| 2007/0000642 A1 | | 1/2007 | Yamazaki et al. | |

FOREIGN PATENT DOCUMENTS

| JP | 2007-012912 A | 1/2007 |
| JP | 2009-094196 A | 4/2009 |
| JP | 2012-160503 A | 8/2012 |

* cited by examiner

*Primary Examiner* — Robert J Hoffberg
*Assistant Examiner* — Hung Dang
(74) *Attorney, Agent, or Firm* — Squire Patton Boggs (US) LLP

(57) ABSTRACT

An electronic device includes: a casing; a board disposed inside the casing and having a heating element mounted thereon; an opposing member disposed inside the casing and having an opposing face opposed to a face of the board on which the heating element is mounted; a heat sink formed by alternately laminating thermal diffusion sheets and adhesive layers each having an opening at a location corresponding to the heating element on the opposing face of the opposing member; and a press member configured to press the heating element against a region of the heat sink corresponding to the opening of the adhesive layer, thus joining the thermal diffusion sheets together at the location of the opening.

6 Claims, 12 Drawing Sheets

ELECTRONIC DEVICE

CROSS-REFERENCE TO RELATED APPLICATION

This application is based upon and claims the benefit of priority of the prior Japanese Patent Application No. 2014-234028, filed on Nov. 18, 2014, the entire contents of which are incorporated herein by reference.

FIELD

The embodiments discussed herein relate to an electronic device.

BACKGROUND

In an electronic device such as a mobile phone, temperature inside the device may increase locally due to heat generated by a heating element mounted on a board. In order to suppress such a rise in the temperature, it is a known practice to employ a heat dissipation structure using a thermal diffusion sheet.

As a technique related to the heat dissipation structure using the thermal diffusion sheet, there is a conventional technique in which a heat sink formed by laminating adhesive layers and thermal diffusion sheets alternately is placed in contact with a heating element. In another conventional technique, an opening is formed in an adhesive layer at a region corresponding to a heating element, and an air layer serving as a heat insulating layer is formed between a member opposed to the heating element via the opening, and a thermal diffusion sheet laminated on the adhesive layer. An example of the related conventional techniques is disclosed in Japanese Laid-open Patent Publication No. 2012-160503.

SUMMARY

In accordance with an aspect of the embodiments, an electronic device includes: a casing; a board disposed inside the casing and having a heating element mounted thereon; an opposing member disposed inside the casing and having an opposing face opposed to a face of the board on which the heating element is mounted; a heat sink formed by alternately laminating thermal diffusion sheets and adhesive layers each having an opening at a location corresponding to the heating element on the opposing face of the opposing member; and a press member configured to press the heating element against a region of the heat sink corresponding to the opening of the adhesive layer, thus joining the thermal diffusion sheets together at the location of the opening.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

These and/or other aspects and advantages will become apparent and more readily appreciated from the following description of the embodiments, taken in conjunction with the accompanying drawing of which.

DESCRIPTION OF EMBODIMENTS

Hereinafter, embodiments of electronic devices disclosed herein are described in detail based on the drawings. It is to be noted that the disclosed technique is not limited to the embodiments. For example, although the following embodiments are described by taking mobile phones (smart phones) as examples of the electronic devices, the disclosed technique may be applied to any other kinds of electronic devices.

Embodiment 1

Figure 1:
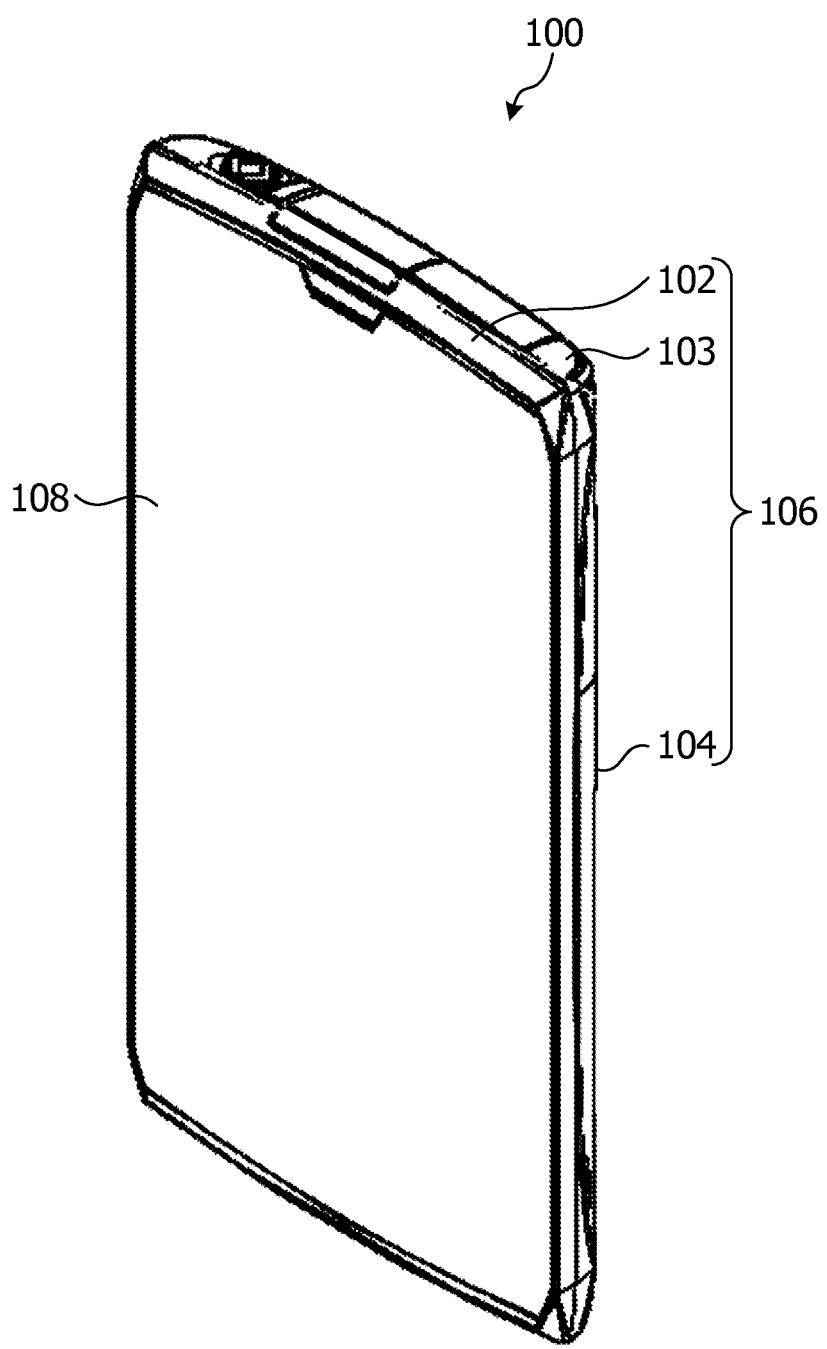
FIG. 1 is a perspective view illustrating an external appearance of a touch panel side of a mobile phone in Embodiment 1.
Figure 2:
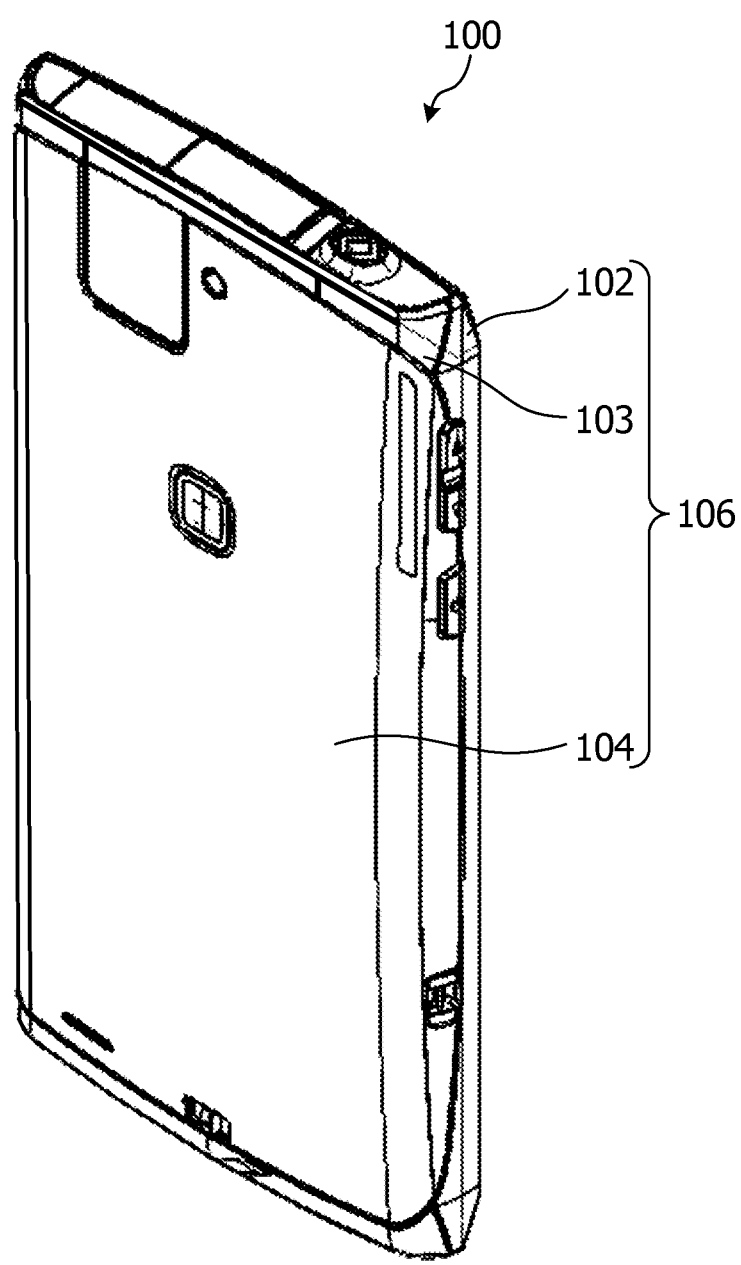
FIG. 2 is a perspective view illustrating an external appearance of a rear cover side of the mobile phone in Embodiment 1.
Figure 3:
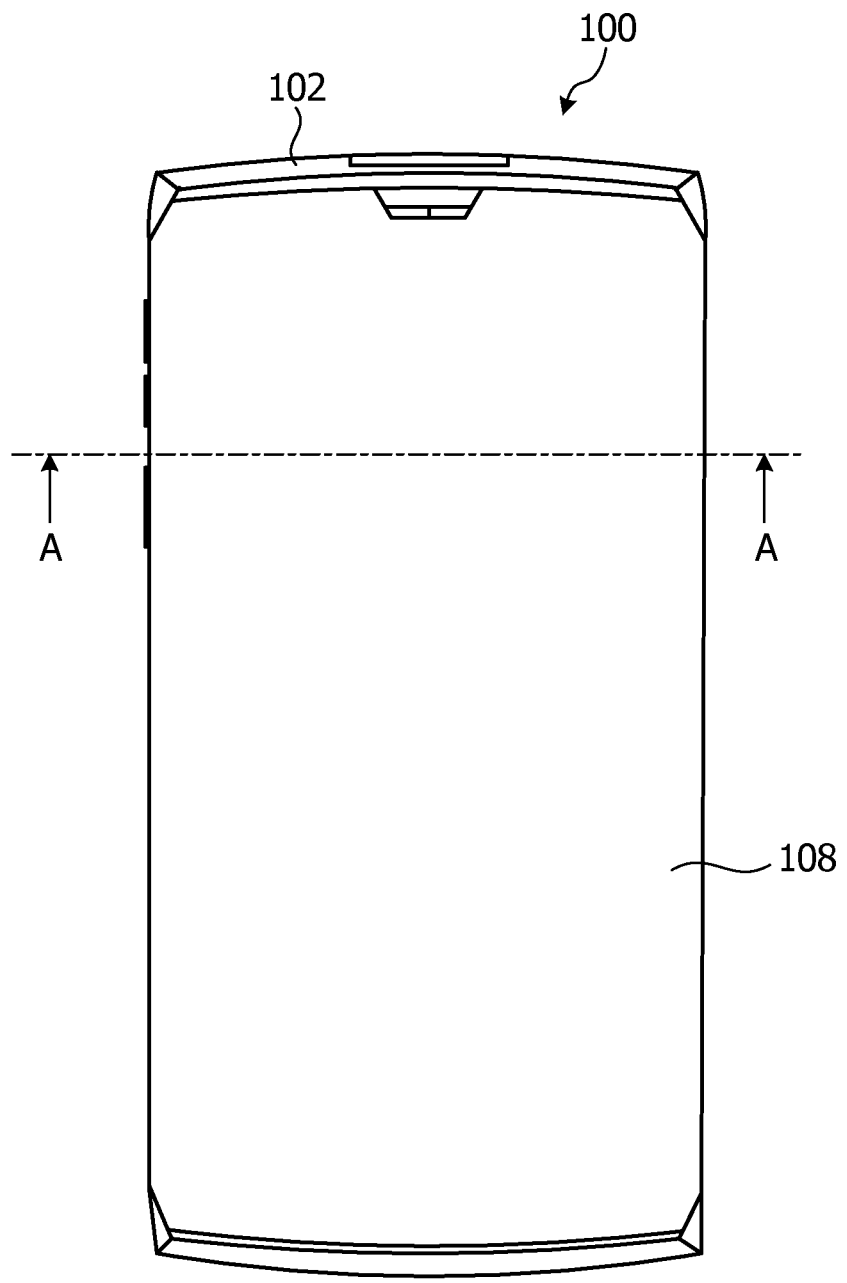
FIG. 3 is a plan view illustrating the external appearance of the tough panel side of the mobile phone in Embodiment 1.

FIG. 1 is a perspective view illustrating an external appearance of a touch panel side of a mobile phone in Embodiment 1. FIG. 2 is a perspective view illustrating an external appearance of a rear cover side of the mobile phone in Embodiment 1. FIG. 3 is a plan view illustrating the external appearance of the touch panel side of the mobile phone in Embodiment 1.

As illustrated in FIGS. 1 to 3, in a mobile phone 100 in Embodiment 1, a front case 102, a rear case 103, and a rear cover 104 are assembled to form a casing 106 having an opening in one surface thereof. The front case 102 is formed in a frame shape, for example. In addition, the rear case 103 is formed in a frame shape corresponding to the front case 102, for example, and is joined with the front case 102. Then, the rear cover 104 is formed so as to cover an opening formed by the rear case 103 on a back surface side, and is joined with the rear case 103. A plate-shaped touch panel 108 is provided in the opening of the casing 106 formed by the front case 102 to thereby define a display surface of the casing 106.

Figure 4:
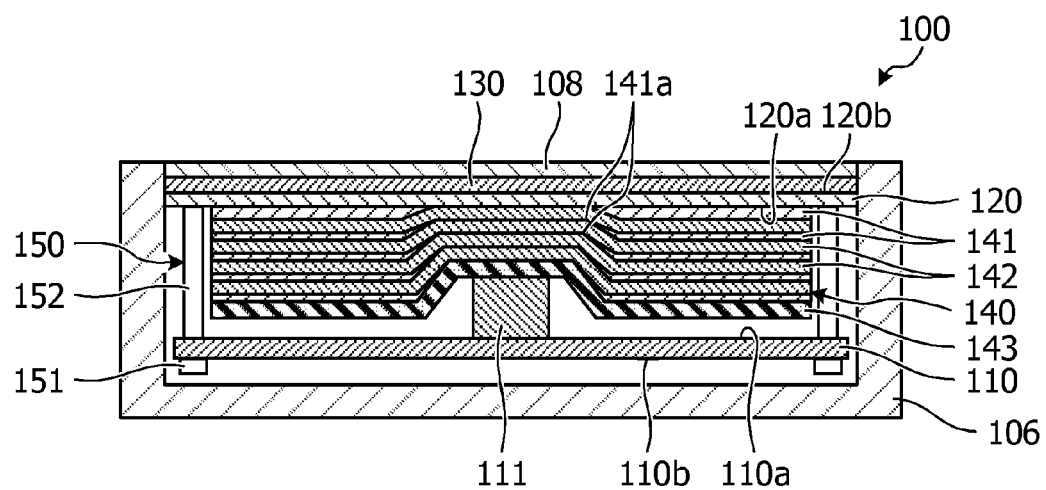
FIG. 4 is a view schematically illustrating a cross section of the mobile phone illustrated in FIG. 3 and taken along an A-A line.

FIG. 4 is a view schematically illustrating a cross section of the mobile phone illustrated in FIG. 3 and taken along an A-A line.

As illustrated in FIG. 4, a circuit board 110 on which a heating element 111 is mounted, a sheet metal 120 fixed to the front case 102, and a liquid crystal display (LCD) module 130 provided on the sheet metal 120 are housed inside the casing 106. In addition, a heat sink 140 and a press member 150 are also housed inside the casing 106. Incidentally, various kinds of components of the mobile phone 100 are also housed inside the casing 106.

The sheet metal 120 is disposed inside the casing 106. The sheet metal 120 includes an opposing face 120a which is opposed to a mount face 110a of the circuit board 110 where the heating element 111 is mounted. The LCD module 130 is provided on an upper face 120b of the sheet metal 120 on the opposite side from the opposing face 120a. A display face of the LCD module 130 is covered with the touch panel 108. The LCD module 130 is one example of an electronic component.

The heat sink 140 is formed by alternately laminating thermal diffusion sheets 142 and adhesive layers 141 each having an opening 141a at a location corresponding to the heating element 111 on the opposing face 120a of the sheet metal 120. The adhesive layers 141 have a function of bonding the thermal diffusion sheets 142 to each other, and bonding the thermal diffusion sheets 142 laminated at the closet position to the opposing face 120a of the sheet metal 120 to the opposing face 120a of the sheet metal 120. Each of the thermal diffusion sheets 142 is a sheet-shaped member having a higher thermal conductivity in a plane direction than a thermal conductivity in a thickness direction. For example, a graphite sheet may be used as the thermal diffusion sheet 142.

An insulating layer 143 is laminated on the adhesive layer 141 laminated at the farthest position from the opposing face 120a of the sheet metal 120. The insulating layer 143 has a function of electrically insulating the heating element 111 from the other components mounted on the circuit board 110. Here, the heating element 111 is pressed against a region of the heat sink 140 corresponding to the opening 141a of the adhesive layer 141, as described later.

Figure 5:
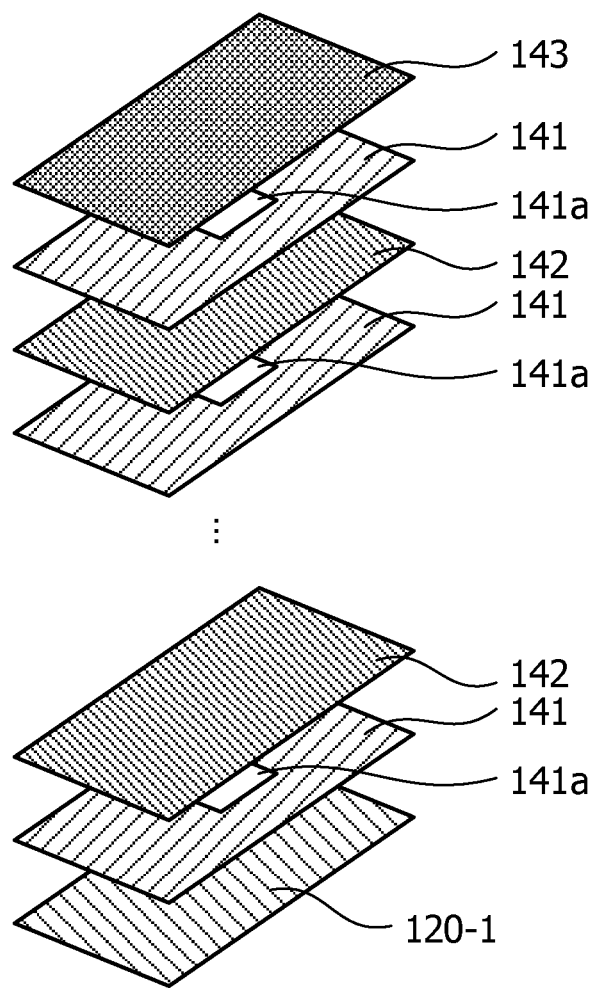
FIG. 5 is an explanatory diagram for illustrating an example of a heat sink manufacturing method.

FIG. 5 is an explanatory diagram for illustrating an example of a heat sink manufacturing method and providing method. In the manufacturing method illustrated in FIG. 5, first, the adhesive layers 141 each having the opening 141a at the location corresponding to the heating element 111 and the thermal diffusion sheets 142 are alternately laminated on exfoliate paper 120-1. Then, the insulating layer 143 is laminated on the adhesive layer 141 laminated at the farthest position from the exfoliate paper 120-1. In this way, the heat sink 140 is formed. When the heat sink 140 is provided, the exfoliate paper 120-1 is removed and the heat sink 140 is bonded to the opposing face 120a of the sheet metal 120. Thus, the heat sink 140 is used.

Figure 6:
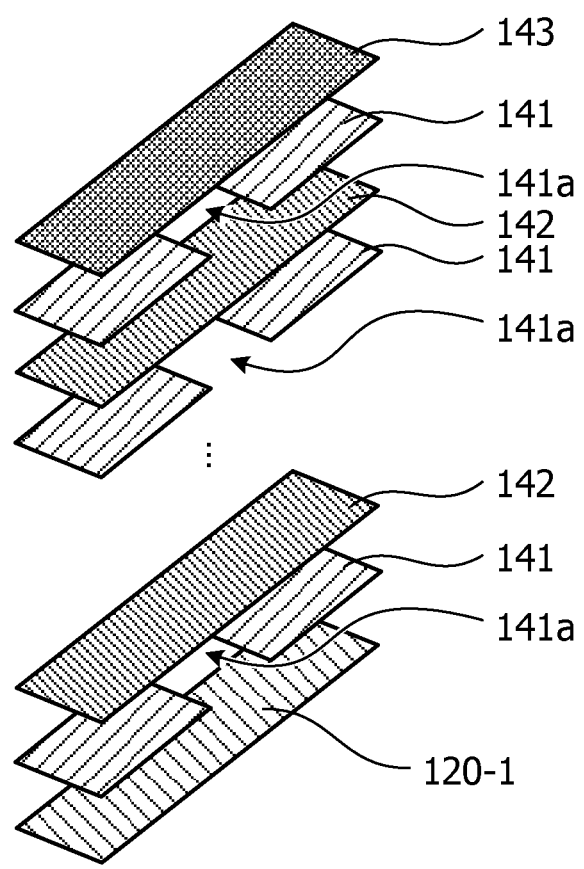
FIG. 6 is an explanatory diagram for illustrating another example of the heat sink manufacturing method.

FIG. 6 is an explanatory diagram for illustrating another example of a heat sink manufacturing method and providing method. As illustrated in FIG. 6, first, the adhesive layers 141 each having the opening 141a at the location corresponding to the heating element 111 and the thermal diffusion sheets 142 are alternately laminated on exfoliate paper 120-1. Each of the openings 141a illustrated in FIG. 6 is formed as a space interposed between end faces of two adhesive layers laminated on the same thermal diffusion sheet 142. Then, the insulating layer 143 is laminated on the adhesive layer 141 laminated at the farthest position from the exfoliate paper 120-1. In this way, the heat sink 140 is formed. When the heat sink 140 is provided, the exfoliate paper 120-1 is removed and the heat sink 140 is bonded to the opposing face 120a of the sheet metal 120. Thus, the heat sink 140 is used.

Figure 7:
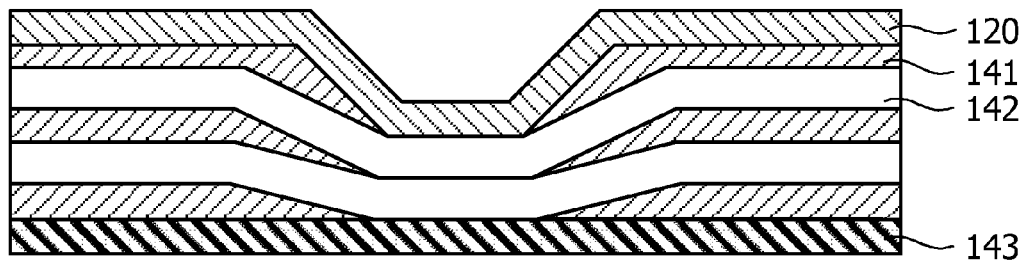
FIG. 7 is a diagram for explaining a heat sink of a modified example.

Although FIGS. 5 and 6 illustrate the examples where the adhesive layers 141 and the thermal diffusion sheets 142 are alternately laminated on the opposing face 120a of the sheet metal 120, the disclosed technique is not limited to this. FIG. 7 is a diagram for explaining a heat sink of a modified example. As illustrated in FIG. 7, for example, the heat sink 140 may be formed by alternately laminating the adhesive layers 141 and the thermal diffusion sheets 142 on the sheet metal 120.

Here, FIG. 4 is again referred to. The press member 150 presses the heating element 111 against the region of the heat sink 140 corresponding to the opening 141a of the adhesive layer 141, and thereby joins the multiple thermal diffusion sheets 142 together at the location of the opening 141a. Specifically, the press member 150 includes a head portion 151 and a rod-like screw portion 152 extending from the head portion 151. The head portion 151 is in contact with a face 110b of the circuit board 110 on the opposite side from the mount face 110a. The rod-like screw portion 152 extends from the head portion 151 to pass through the circuit board 110, and is movably engaged with a screw hole (not illustrated) formed in the sheet metal 120. Then, the press member 150 presses the circuit board 110 toward the heat sink 140 by using the head portion 151 in conjunction with the movement of the rod-like screw portion 152, and thereby presses the heating element 111 against the region of the heat sink 140 corresponding to the opening 141a of the adhesive layer 141. Thus, at the location of the openings 141a, the pressing force from the heating element 111 is transmitted to the multiple thermal diffusion sheets 142 in the thickness direction of the heat sink 140, and the multiple thermal diffusion sheets 142 are joined together by the transmitted pressing force.

In addition, the press member 150 presses the heating element 111 via the insulating layer 143 against the region of the heat sink 140 corresponding to the opening 141a of the adhesive layer 141. Thus, the heating element 111 pressed against the region of the heat sink 140 corresponding to the opening 141a of the adhesive layer 141 and the other components mounted on the circuit board 110 are electrically isolated from each other by the insulating layer 143.

Hereinafter, description is provided for heat transfer conduction from the heating element 111 to the heat sink 140.

Figure 8:
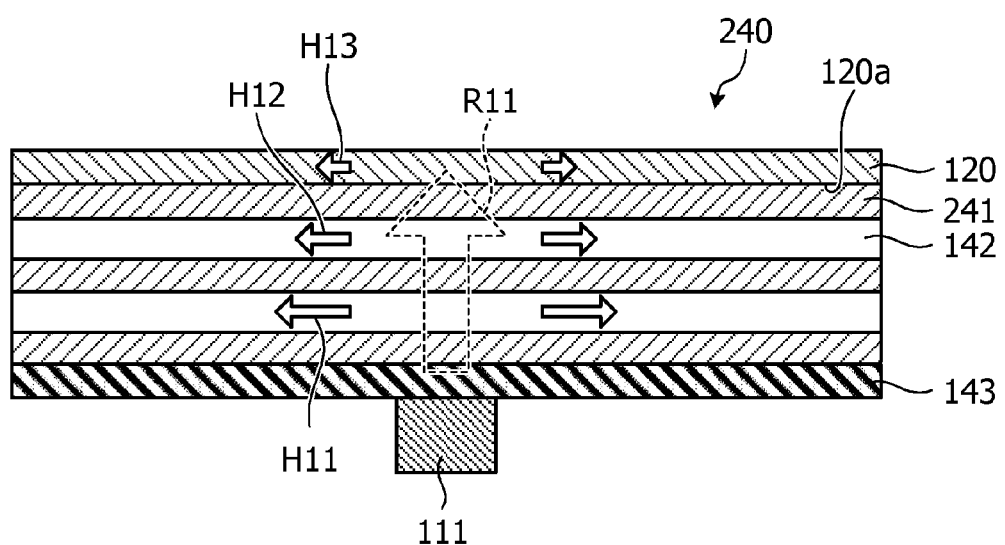
FIG. 8 is a cross sectional view schematically illustrating a state where a heating element is pressed against a heat sink in a mobile phone of a comparative example.

Firstly, a mobile phone using a general heat sink is described as a comparative example. FIG. 8 is a cross sectional view schematically illustrating a state where a heating element is pressed against a heat sink in a mobile phone of a comparative example. In the mobile phone of the comparative example, adhesive layers included in the heat sink have a different shape from that in the mobile phone 100 of Embodiment 1, and the other elements are the same as those of the mobile phone 100 of Embodiment 1. For this reason, FIG. 8 illustrates with the same reference numerals assigned to the same elements as those in Embodiment 1.

In the mobile phone of the comparative example, a heat sink 240 is formed by alternately laminating adhesive layers 241 and thermal diffusion sheets 142 on an opposing face 120a of a sheet metal 120. As illustrated in FIG. 8, the adhesive layers 241 do not have openings at a location corresponding to the heating element 111. In other words, the multiple thermal diffusion sheets 142 are bonded to each other with the adhesive layers 241 at the location corresponding to the heating element 111. For this reason, at the location corresponding to the heating element 111, the adhesive layers 241 having a lower thermal conductivity than that of the thermal diffusion sheets 142 act as thermal resistance, and thermal resistance R11 of the entire heat sink 240 in the thickness direction increases. In this case, as indicated by the sizes of arrows H11 to H13 in FIG. 8, the quantity of heat transferred from the heating element 111 to the thermal diffusion sheets 142 decreases as the distance from the heating element 111 increases. This may result in a decrease in the heat dissipation efficiency because the heat from the heating element 111 is not transferred efficiently to the thermal diffusion sheet 142 laminated at a position far from the heating element 111.

Figure 9:
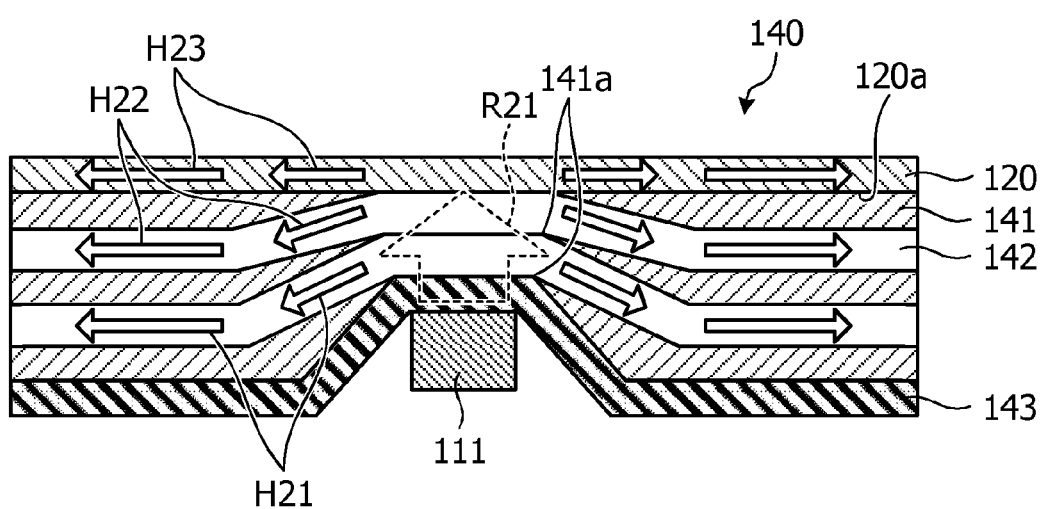
FIG. 9 is a cross sectional view schematically illustrating a state where the heating element is pressed against the heat sink in the mobile phone of Embodiment 1.

In contrast to this, an explanation is provided for the mobile phone 100 of Embodiment 1. FIG. 9 is a cross sectional view schematically illustrating a state where the heating element is pressed against the heat sink in the mobile phone of Embodiment 1.

In the mobile phone 100 of Embodiment 1, the heat sink 140 is formed in such a way that the adhesive layers 141 each having the opening 141a at a location opposed to the heating element 111, and the thermal diffusion sheets 142 are alternately laminated on the opposing face 120a of the sheet metal 120. The press member 150 presses the heating element 111 against the region corresponding to the opening 141a of the adhesive layer 141 of the heat sink 140, and thereby joins the multiple thermal diffusion sheets 142 together at the location of the opening 141a. In other words, at the location corresponding to the heating element 111, the multiple thermal diffusion sheets 142 are in intimate contact with each other with no adhesive layers 141 interposed in between. For this reason, the adhesive layers 141 do not act as thermal resistance at the location corresponding to the heating element 111, and an increase in thermal resistance R21 of the entire heat sink 140 in the thickness direction is suppressed. In this case, as indicated by the sizes of arrows H21 to H23 in FIG. 9, the quantity of heat transferred from the heating element 111 to the thermal diffusion sheets 142 is kept substantially equal irrespective of the distance from the heating element 111. This may result in an improvement in the heat dissipation efficiency because the heat from the heating element 111 is transferred efficiently to the thermal diffusion 142 laminated at a position far from the heating element 111.

As described above, in Embodiment 1, the press member 150 presses the heating element 111 against the heat sink 140 formed by alternately laminating the adhesive layers 141 having the opening 141a and the thermal diffusion sheets 142, and thereby joins the multiple thermal diffusion sheets 142 together at the location of the opening 141a. In this way, at the location corresponding to the heating element 111, the multiple thermal diffusion sheets 142 are in intimate contact with each other with no adhesive layers 141 interposed in between. For this reason, in Embodiment 1, an increase in the thermal resistance of the entire heat sink 140 in the thickness direction may be suppressed, and accordingly the heat from the heating element 111 may be transferred efficiently to the thermal diffusion sheet 142 laminated at the position far from the heating element 111. This may result in an improvement in the heat dissipation efficiency according to Embodiment 1.

Embodiment 2

Embodiment 2 is different from Embodiment 1 only in that a recess portion is formed in a sheet metal 120 in a mobile phone 200 of Embodiment 2, and is the same as Embodiment 1 in the other elements. For this reason, in the following description, the same elements as those in Embodiment 1 are denoted by the same reference numerals, and the description thereof is omitted.

Figure 10:
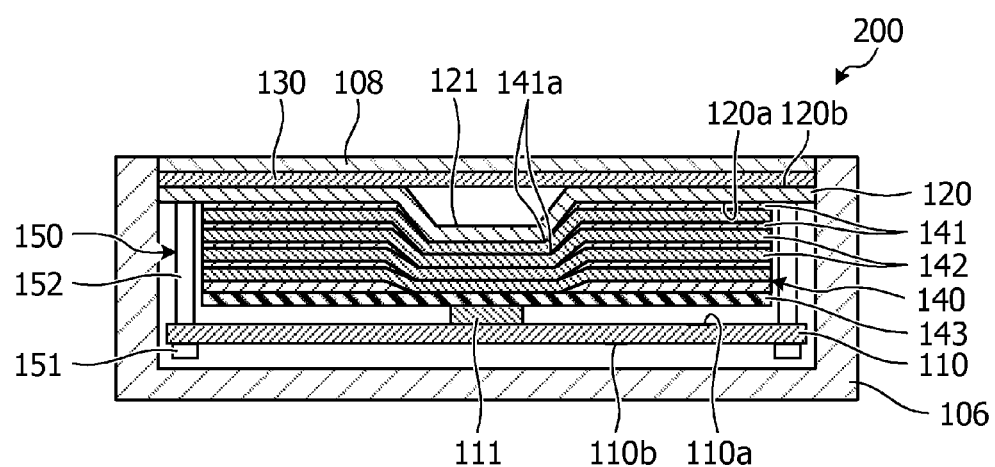
FIG. 10 is a cross sectional view of a mobile phone of Embodiment 2.

FIG. 10 is a cross sectional view of a mobile phone of Embodiment 2. As illustrated in FIG. 10, in a mobile phone 200 of Embodiment 2, a recess portion 121 is formed in a region of a sheet metal 120 corresponding to a heating element 111. The recess portion 121 is recessed in a direction away from an LCD module 130, in other words, a direction away from an upper face 120b of the sheet metal 120. A space formed between the recess portion 121 of the sheet metal 120 and the LCD module 130 serves as an air layer. When a press member 150 presses the heating element 111 against a region of a heat sink 140 corresponding to an opening 141a, the heat sink 140 is interposed between the recess portion 121 and the heating element 111.

As described above, in Embodiment 2, the recess portion 121 recessed in the direction away from the LCD module 130 is formed in the region of the sheet metal 120 corresponding to the heating element 111. Thus, in Embodiment 2, the air layer may be formed between the recess portion 121 of the sheet metal 120 and the LCD module 130, and the heat transferred from the heating element 111 to the LCD module 130 via the heat sink 140 may be blocked by the air layer. In addition, in Embodiment 2, since the heat sink 140 is interposed between the recess portion 121 and the heating element 111, the multiple thermal diffusion sheets 142 may be brought into firm and intimate contact with each other at the location of the opening 141a of the adhesive layer 141. Consequently, according to Embodiment 2, a local temperate rise of the LCD module 130 may be suppressed, and at the same time the heat dissipation efficiency may be further improved.

Embodiment 3

Embodiment 3 is different from Embodiment 2 only in that a recess portion 121 of a sheet metal 120 is filled with a thermal insulator in a mobile phone 300 of Embodiment 3, and is the same as Embodiment 2 in the other elements. For this reason, in the following description, the same elements as those in Embodiment 2 are denoted by the same reference numerals, and the description thereof is omitted.

Figure 11:
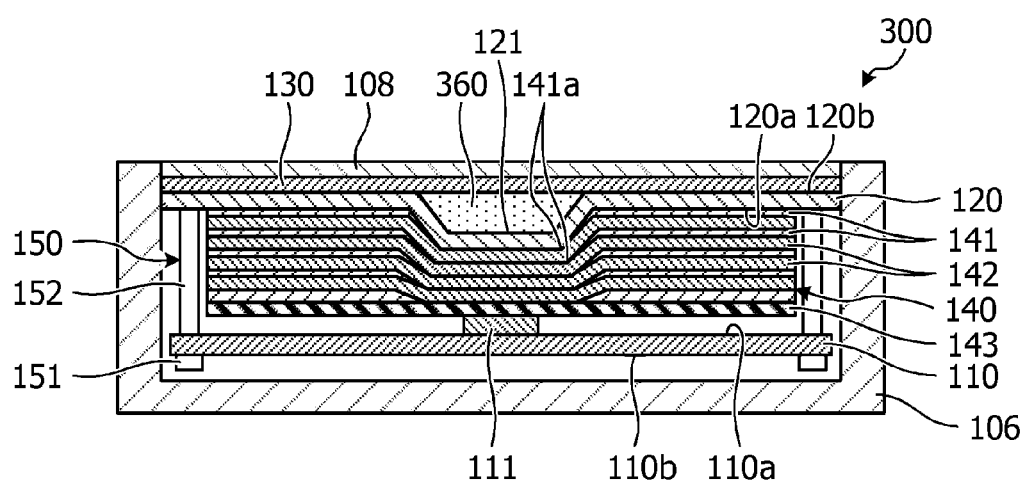
FIG. 11 is a cross sectional view of a mobile phone of Embodiment 3.

FIG. 11 is a cross sectional view of a mobile phone in Embodiment 3. As illustrated in FIG. 11, in a mobile phone 300 of Embodiment 3, a recess portion 121 in a sheet metal 120 is filled with a thermal insulator 360. The thermal insulator 360 has a lower thermal conductivity than that of the air.

As described above, in Embodiment 3, since the recess portion 121 in the sheet metal 120 is filled with the thermal insulator 360, the heat transferred from the heating element 111 to the LCD module 130 via the heat sink 140 may be blocked by the thermal insulator 360. As a result, according to Embodiment 3, a local temperature rise in the LCD module 130 may be more stably suppressed.

Embodiment 4

Embodiment 4 is different from Embodiment 2 only in that a heat transfer member is provided in a joined portion of multiple thermal diffusion sheets 142 in a mobile phone 400 of Embodiment 4, and is the same as Embodiment 2 in the other elements. For this reason, in the following description, the same elements as those in Embodiment 2 are denoted by the same reference numerals, and the description thereof is omitted.

Figure 12:
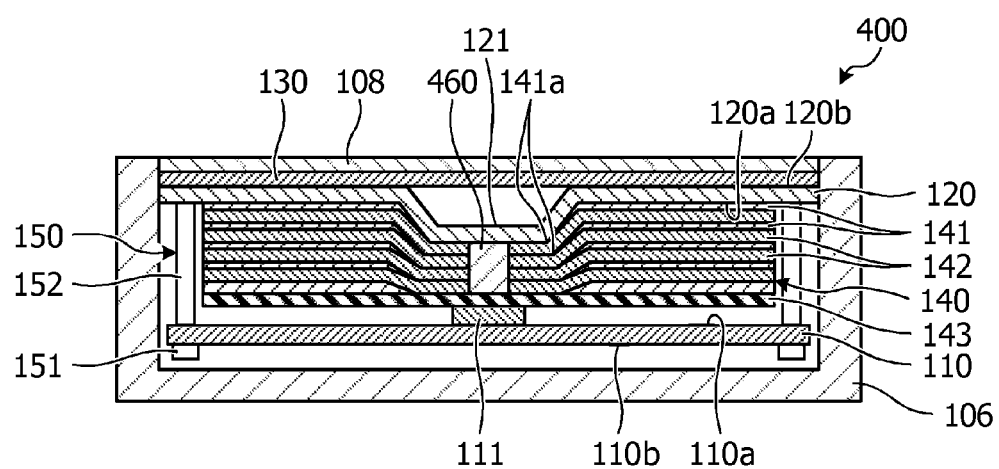
FIG. 12 is a cross sectional view of a mobile phone of Embodiment 4.

FIG. 12 is a cross sectional view of a mobile phone in Embodiment 4. As illustrated in FIG. 12, in the mobile phone 400 of Embodiment 4, a heat transfer member 460 is provided in the joined portion of the multiple thermal diffusion sheets 142. The joined portion of the multiple thermal diffusion sheets 142 is a portion obtained by joining together the multiple thermal diffusion sheets 142 at the location of opening 141a of adhesive layer 141. The heat transfer member 460 passes through the joined portions of the multiple thermal diffusion sheets 142. The heat transfer member 460 has a higher thermal conductivity than the thermal conductivity of the thermal diffusion sheets 142 in the thickness direction. For example, the thermal conductivity of the heat transfer member 460 may be 25 W/m·K or higher.

As described above, in Embodiment 4, since the joined portion of the multiple thermal diffusion sheets 142 is provided with the heat transfer member 460, the heat from the heating element 111 may be transferred efficiently in the thickness direction of the thermal diffusion sheets 142. As a result, according to Embodiment 4, the heat dissipation efficiency in the thickness direction of the thermal diffusion sheets 142 may be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
   a casing;
   a board disposed inside the casing and having a heating element mounted thereon;
   an opposing member disposed inside the casing and having an opposing face opposed to a face of the board on which the heating element is mounted;
   a heat sink formed by alternately laminating thermal diffusion sheets and adhesive layers on the opposing face of the opposing member, at least one of the adhesive layers having an opening at a location corresponding to the heating element; and
   a press member disposed inside the casing and configured to press the heating element mounted on the board against a region of the heat sink, the region of the heat sink corresponding to the opening of the adhesive layer.

2. The electronic device according to claim 1, further comprising:
   an electronic component provided on an upper face of the opposing member opposite to the opposing face,
   wherein a recess portion recessed in a direction away from the upper face is formed in a region of the opposing member corresponding to the heating element.

3. The electronic device according to claim 2,
   wherein the recess portion is filled with a thermal insulator.

4. The electronic device according to claim 1, further comprising:
   a heat transfer member provided at joined portions of the plurality of thermal diffusion sheets, the heat transfer member passing through the joined portions.

5. The electronic device according to claim 1, further comprising:
   an insulating layer laminated on an adhesive layer laminated at a farthest position from the opposing face of the opposing member among the adhesive layers,
   wherein the press member presses the heating element via the insulating layer against the region of the heat sink corresponding to the opening of the adhesive layer.

6. The electronic device according to claim 1,
   the press member comprising:
   a head portion being in contact with a face of the board opposite to the face on which the heating element is mounted; and
   a rod-shaped screw portion extending from the head portion to pass through the board, and being movably engaged with a screw hole formed in the opposing member,
   wherein in conjunction with movement of the rod-shaped screw portion, the head portion presses the board in a direction toward the heat sink, so as to press the heating element against the region of the heat sink corresponding to the opening of the adhesive layer.

* * * * *